(12) United States Patent
Seaton et al.

(10) Patent No.: US 11,083,104 B2
(45) Date of Patent: Aug. 3, 2021

(54) VARIABLE RELIABILITY AND CAPACITY DATA CENTER DESIGN

(71) Applicant: Microsoft Technology Licensing, LLC, Redmond, WA (US)

(72) Inventors: Scott Thomas Seaton, Kirkland, WA (US); Ryan Douglas Carver, Seattle, WA (US); Osvaldo P. Morales, Normandy Park, WA (US); Keith Allen Krueger, Monroe, WA (US); Lalu Vannankandy Kunnath, Snoqualmie, WA (US); Peter Odongo Wangia, Kirkland, WA (US); Kris Sean Redding, Bothell, WA (US); Eric Matthew Beal, Redmond, WA (US); Jose Seah Delapaz, Bellevue, WA (US); Steve Todd Solomon, Kirkland, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/716,392

(22) Filed: Dec. 16, 2019

(65) Prior Publication Data
US 2021/0185848 A1   Jun. 17, 2021

(51) Int. Cl.
G06F 1/18 (2006.01)
H05K 7/14 (2006.01)

(52) U.S. Cl.
CPC .......... H05K 7/1492 (2013.01); G06F 1/189 (2013.01); H05K 7/1497 (2013.01)

(58) Field of Classification Search
None
See application file for complete search history.

(56) References Cited

U.S. PATENT DOCUMENTS 7,512,830 B2   3/2009 Chu et al.
8,484,354 B2   7/2013 Schlack
(Continued)

FOREIGN PATENT DOCUMENTS

EP   3527052 A2   8/2019

OTHER PUBLICATIONS

"International Search Report and Written Opinion Issued in PCT Application No. PCT/US20/060316", dated Jan. 29, 2021, 13 Pages.

Primary Examiner — Courtney L Smith
(74) Attorney, Agent, or Firm — Thomas M. Hardman; Ray Quinney & Nebeker; Phong Dinh

(57) ABSTRACT

A design for the electrical infrastructure of a data center enables two different configurations to be utilized, including a distributed, redundant configuration that provides higher reliability and a non-redundant configuration that provides higher capacity. In the distributed, redundant configuration, each server in the data center draws power from at least two different power supply systems. This enables load shifting when a power supply system becomes unavailable, which can have the effect of increasing server reliability. In the non-redundant configuration, each server in the data center draws power from only one power supply system. Load shifting is not utilized in the non-redundant configuration, which eliminates the need to maintain reserve capacity and thereby increases capacity. Advantageously, it is possible to switch between these two configurations without making any internal changes to the data center other than modifying connections between sets of server racks and power buses.

6 Claims, 6 Drawing Sheets

(56) References Cited

U.S. PATENT DOCUMENTS

| | | | |
|---|---|---|---|
| 9,041,250 B1* | 5/2015 | Czamara | G06F 1/28 |
| | | | 307/64 |
| 9,146,814 B1 | 9/2015 | van der Merwe et al. | |
| 9,350,601 B2 | 5/2016 | Jain | |
| 9,451,722 B2* | 9/2016 | Alshinnawi | H05K 5/0247 |
| 9,723,742 B2* | 8/2017 | Steeves | G06F 1/189 |
| 9,846,467 B2* | 12/2017 | Gardner | G06F 11/2015 |
| 9,891,682 B1* | 2/2018 | Czamara | G06F 1/266 |
| 10,404,041 B2* | 9/2019 | Huang | H01R 33/94 |
| 2007/0217178 A1* | 9/2007 | Johnson, Jr. | H05K 7/1457 |
| | | | 361/826 |
| 2009/0034166 A1* | 2/2009 | Rasmussen | H05K 7/1492 |
| | | | 361/623 |
| 2013/0250755 A1 | 9/2013 | Clark et al. | |
| 2015/0357798 A1* | 12/2015 | Loeffler | H02B 1/20 |
| | | | 361/624 |
| 2017/0169087 A1 | 6/2017 | Kapadia et al. | |
| 2017/0374149 A1 | 12/2017 | Hawkins et al. | |
| 2019/0044370 A1* | 2/2019 | Mondal | G06F 1/30 |
| 2019/0377394 A1 | 12/2019 | Klaba | |

\* cited by examiner

VARIABLE RELIABILITY AND CAPACITY DATA CENTER DESIGN

CROSS-REFERENCE TO RELATED APPLICATIONS

N/A

BACKGROUND

A data center is a physical facility that is used to house computer systems and associated components. A data center typically includes a large number of servers, which may be stacked in racks that are placed in rows. A colocation center (which is sometimes referred to simply as a "colo") is a type of data center where equipment, space, and bandwidth are available for rental to customers.

The electrical infrastructure of a data center (such as a colocation center) includes a connection to the main power grid, which is typically provided by the local utility company. The electricity from the local utility company is typically delivered with a medium voltage. The medium-voltage electricity is then transformed by one or more transformers to low voltage for use within the data center. To ensure uninterrupted operation even in the case of a large-scale power outage, data centers are typically connected to at least one backup generator. Electricity from the backup generator may be delivered at low voltage, or it may be delivered at medium voltage and then transformed to low voltage for use within the data center. The low-voltage electricity is distributed to endpoints through one or more Uninterrupted Power Supply (UPS) systems and one or more power distribution units (PDUs). A UPS system provides short-term power when the input power source fails and protects critical components against voltage spikes, harmonic distortion, and other common power problems. A PDU includes multiple outputs that are designed to distribute electric power to racks of computers and networking equipment located within a data center.

The electrical infrastructure of a data center can utilize a plurality of different cells. Each of the cells can include its own power supply system. In this context, the term "power supply system" may refer to one or more components that provide a source of power to at least some of the servers and/or other components in the data center. A power supply system may include one or more of the components described previously (e.g., a connection to the main grid, a backup generator, one or more transformers, a UPS system, and one or more PDUs).

SUMMARY

In accordance with one aspect of the present disclosure, a method is disclosed that includes providing a plurality of power supply systems, a plurality of sets of server racks, and a plurality of power buses. The plurality of power supply systems are configured to supply electrical power to at least a section of a data center. The plurality of power buses are configured to conduct the electrical power from the plurality of power supply systems to the plurality of sets of server racks. The method also includes connecting the plurality of sets of server racks and the plurality of power buses in accordance with a first connection pattern to place the section of the data center in a distributed, redundant configuration. Each server rack in the plurality of sets of server racks is connected to two different power supply systems when the plurality of sets of server racks and the plurality of power buses are connected in accordance with the first connection pattern. The method also includes connecting the plurality of sets of server racks and the plurality of power buses in accordance with a second connection pattern to place the section of the data center in a non-redundant configuration. Each server rack in the plurality of sets of server racks is connected to only one power supply system when the plurality of sets of server racks and the plurality of power buses are connected in accordance with the second connection pattern.

The distributed, redundant configuration may provide higher server reliability than the non-redundant configuration. The non-redundant configuration may provide higher power capacity than the distributed, redundant configuration.

The method may further include transitioning between the distributed, redundant configuration and the non-redundant configuration without making any internal changes to the data center other than modifying connections between the plurality of sets of server racks and the plurality of power buses.

Connecting the plurality of sets of server racks and the plurality of power buses in accordance with the first connection pattern may include connecting each server rack in the plurality of sets of server racks to two different power buses that are connected to two different power supply systems. Connecting the plurality of sets of server racks and the plurality of power buses in accordance with the second connection pattern may include connecting each server rack in the plurality of sets of server racks to only one power bus.

The plurality of power supply systems may operate at full capacity without maintaining any reserve capacity when the plurality of sets of server racks and the plurality of power buses are arranged in the non-redundant configuration. The plurality of power supply systems may maintain reserve capacity during normal operation when the plurality of sets of server racks and the plurality of power buses are arranged in the distributed, redundant configuration. The distributed, redundant configuration may enable load shifting when a power supply system becomes unavailable.

The method may further include connecting equal numbers of power buses to different power supply systems of the plurality of power supply systems.

In accordance with another aspect of the present disclosure, a system is disclosed that includes a plurality of power supply systems that are configured to supply electrical power to at least a section of a data center. The system also includes a first plurality of sets of server racks and a first plurality of power buses that are configured to conduct the electrical power from at least some of the plurality of power supply systems to the first plurality of sets of server racks. The first plurality of sets of server racks and the first plurality of power buses are connected in accordance with a first connection pattern to create a distributed, redundant configuration. The system also includes a second plurality of sets of server racks and a second plurality of power buses that are configured to conduct the electrical power from at least some of the plurality of power supply systems to the second plurality of sets of server racks. The second plurality of sets of server racks and the second plurality of power buses are connected in accordance with a second connection pattern to create a non-redundant configuration.

The distributed, redundant configuration may provide higher server reliability than the non-redundant configuration. The non-redundant configuration may provide higher power capacity than the distributed, redundant configuration.

Each server rack in the first plurality of sets of server racks may be connected to two different power supply systems. Each server rack in the second plurality of sets of server racks may be connected to only one power supply system.

The first plurality of power supply systems may maintain reserve capacity during normal operation. The second plurality of power supply systems may operate at full capacity without maintaining any reserve capacity.

In accordance with another aspect of the present disclosure, a system is disclosed that includes a plurality of power supply systems that are configured to supply electrical power to at least a section of a data center. The system also includes a plurality of sets of server racks and a plurality of power buses that are configured to conduct the electrical power from the plurality of power supply systems to the plurality of sets of server racks. Each server rack in the plurality of sets of server racks has two connections to a power bus. Each server rack in the plurality of sets of server racks is connected to only one power bus. Adjacent server racks in a row of server racks are connected to different power buses.

The plurality of power supply systems may operate at full capacity without maintaining any reserve capacity. Equal numbers of power buses may be connected to different power supply systems of the plurality of power supply systems.

In some embodiments, a first power bus runs parallel to a first side of the row of server racks, and a second power bus runs parallel to a second side of the row of server racks. Every other server rack in the row of server racks may be connected to a different one of the first power bus and the second power bus.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description that follows. Features and advantages of the disclosure may be realized and obtained by means of the systems and methods that are particularly pointed out in the appended claims. Features of the present disclosure will become more fully apparent from the following description and appended claims, or may be learned by the practice of the disclosed subject matter as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. Understanding that the drawings depict some example embodiments, the embodiments will be described and explained with additional specificity and detail through the use of the accompanying drawings in which.

DETAILED DESCRIPTION

Figure 1:
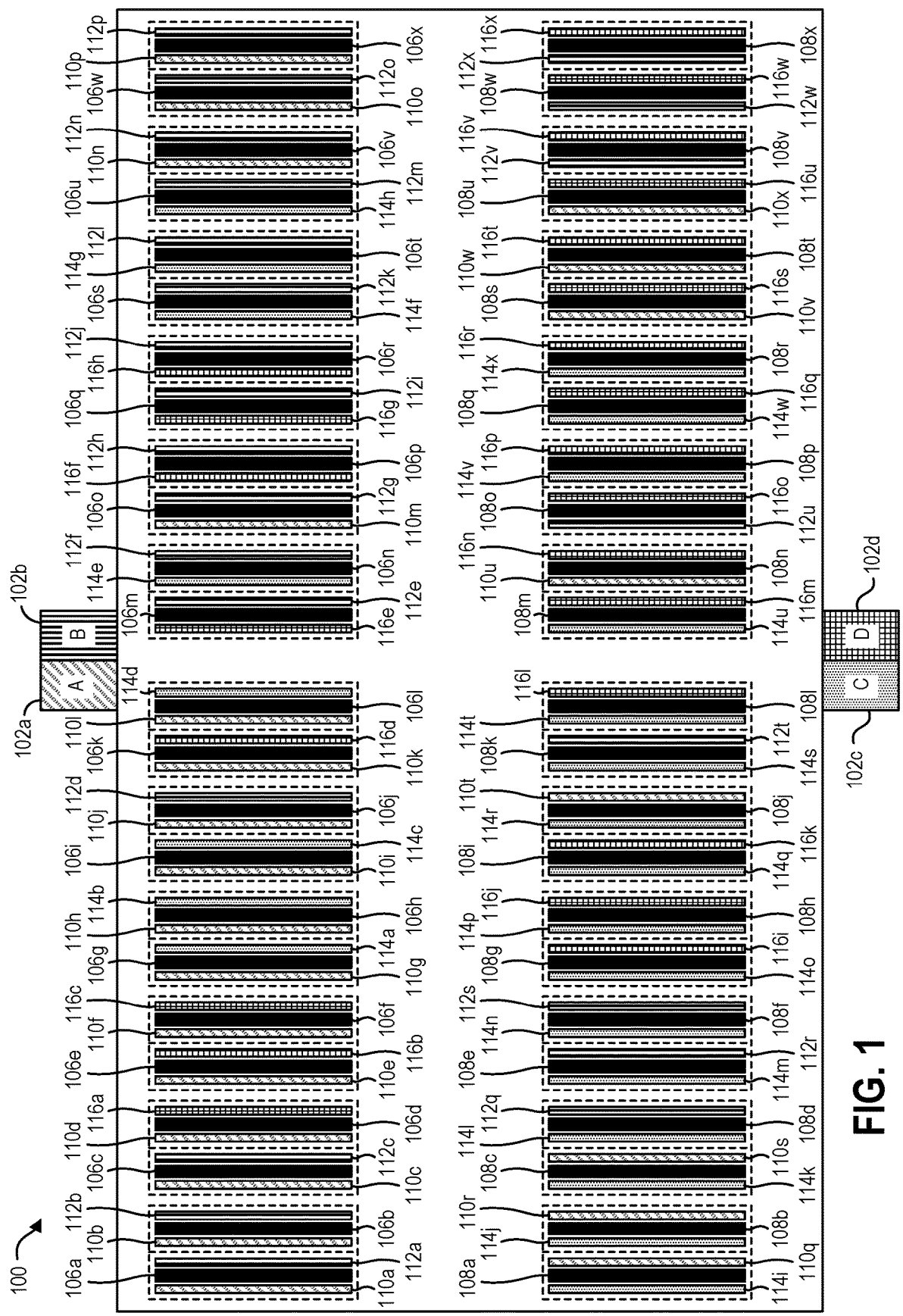
FIG. 1 illustrates an example showing how servers and power buses can be arranged in a section of a data center in order to enable different configurations to be utilized.

The present disclosure is generally related to a design for the electrical infrastructure of a data center that enables two different configurations to be utilized without requiring any significant changes to the underlying infrastructure components. These configurations can include a first configuration that provides higher reliability at the cost of lower capacity, and a second configuration that provides higher capacity at the cost of lower reliability. The first configuration may be referred to herein as a "higher reliability, lower capacity" configuration, and the second configuration may be referred to herein as a "higher capacity, lower reliability" configuration.

In this context, the term "reliability" can refer to the ability of the electrical infrastructure of a data center to supply electrical power to servers and other electrical components in a data center in a consistent and dependable way, such that the servers and other electrical components are able to remain in operating condition for a high percentage of the time. In other words, reliability can be considered to be synonymous with availability. On the other hand, the term "capacity" can refer to the amount of electrical power that can be supplied by the electrical infrastructure of a data center. A higher capacity, lower reliability configuration may be capable of supplying a greater amount of electrical power than a higher reliability, lower capacity configuration. However, a higher reliability, lower capacity configuration may be capable of supplying electrical power more consistently and dependably than a higher capacity, lower reliability configuration. More specifically, a higher reliability, lower capacity configuration may be capable of producing higher server availability than a higher capacity, lower reliability configuration.

As noted previously, the electrical infrastructure of a data center can utilize a plurality of different cells, and each of the cells can include its own power supply system. For the higher reliability, lower capacity configuration, the electrical infrastructure can utilize a distributed, redundant architecture in which each server in the data center draws power from at least two different power supply systems. If a power supply system becomes unavailable, the load that was being provided by the now unavailable power supply system can be shifted to one or more other power supply systems. In this way, the servers that were being supplied by the now unavailable power supply system can continue to receive power. Therefore, the use of a distributed, redundant architecture enables load shifting, which can have the effect of increasing the reliability of servers in a data center.

Load shifting in the manner just described involves increasing the amount of power that is supplied by at least some of the other power supply systems in the data center. To reduce the likelihood that load shifting would cause any of the components of the other power supply systems to become overloaded, the electrical infrastructure can be designed so that it operates with a certain amount of reserve capacity under normal circumstances. In other words, under normal circumstances (when all power supply systems are operational), the utilization of a data center can be limited so that the servers' total power consumption does not exceed a threshold level that is lower than the electrical infrastructure's total capacity. The difference between this threshold level and the total capacity can be thought of as the reserve capacity. When a power supply system fails and the load that was being supplied by the now unavailable power supply system is shifted to other power supply systems, these other power supply systems can tap into their reserve capacity to handle the additional load.

As noted above, in addition to the higher reliability, lower capacity configuration that was just described, another possible configuration for the electrical infrastructure of a data center is a higher capacity, lower reliability configuration. The higher capacity, lower reliability configuration does not utilize load shifting. Therefore, the higher capacity, lower reliability configuration can utilize a non-redundant architecture in which each server in the data center draws power from only one power supply system. Because load shifting is not utilized, there is no need to maintain any reserve capacity. Eliminating the need to maintain reserve capacity effectively increases the capacity of the data center's electrical infrastructure. In other words, the utilization of the data center can be higher than it would be if reserve capacity had to be maintained. However, this increased capacity is achieved at the expense of lower reliability. Without the possibility of load shifting, the failure of a power supply system causes the servers that were being supplied by the now unavailable power supply system to lose power and experience an outage.

One aspect of the present disclosure includes techniques for arranging the components of a data center's electrical infrastructure so that it is possible to easily switch between the higher reliability, lower capacity configuration that utilizes a distributed, redundant architecture and the higher capacity, lower reliability configuration that utilizes a non-redundant architecture. Advantageously, the techniques disclosed herein make it possible to switch between these two configurations without making any significant changes to the underlying infrastructure components.

FIG. 1 illustrates an example showing how servers and power buses can be arranged in a section of a data center 100 in order to facilitate the techniques disclosed herein. In this example, it will be assumed that there are four cells that are configured to supply power to servers in a particular section of the data center 100. These cells will be referred to as cell A, cell B, cell C, and cell D. Each of the cells includes a power supply system. In particular, cell A includes a power supply system 102a, cell B includes a power supply system 102b, cell C includes a power supply system 102c, and cell D includes a power supply system 102d.

The data center 100 shown in FIG. 1 includes a plurality of sets of server racks 106a-x, 108a-x. In this context, the term "rack" can refer to a physical structure that holds servers. A set of server racks can include a plurality of server racks.

The data center 100 shown in FIG. 1 includes a plurality of power buses. More specifically, the data center 100 includes a first set of power buses 110a-x that are connected to the power supply system 102a of cell A, a second set of power buses 112a-x that are connected to the power supply system 102b of cell B, a third set of power buses 114a-x that are connected to the power supply system 102c of cell C, and a fourth set of power buses 116a-x that are connected to the power supply system 102d of cell D. In this context, the term "power bus" can refer to an electrical conductor that is configured to conduct electrical power. A power bus can alternatively be referred to as a busbar. The power buses 110a-x, 112a-x, 114a-x, 116a-x shown in FIG. 1 are configured to conduct electrical power from the power supply systems 102a-d of cells A, B, C, and D to the sets of server racks 106a-x, 108a-x.

The sets of server racks 106a-x, 108a-x and the sets of power buses 110a-x, 112a-x, 114a-x, 116a-x are arranged so that each set of server racks is accessible to two power buses that are connected to different power supply systems. In some embodiments, a set of server racks is accessible to two power buses if the set of server racks can be connected to both of the power buses without having to physically move (or reposition) the set of server racks. In other embodiments, a set of server racks is accessible to two power buses if the set of server racks can be connected to both of the power buses without having to physically move (or reposition) the set of server racks or either of the power buses.

In the depicted example, each set of server racks is located between two power buses that are connected to different power supply systems. For example, the first set of server racks 106a is located between a power bus 110a that is connected to the power supply system 102a of cell A and a power bus 112a that is connected to the power supply system 102b of cell B. This makes it possible for each server rack in the set of server racks 106a to be connected to one or both of the power buses 110a, 112a, as will be discussed in greater detail below. Connecting a server rack to a power bus can be accomplished via one or more electrical cables.

There are equal numbers of power buses that are connected to the different power supply systems 102a-d of the various cells. More specifically, in the depicted example there are four cells. Thus, of the total number of power buses, one fourth are power buses 110a-x that are connected to the power supply system 102a of cell A, one fourth are power buses 112a-x that are connected to the power supply system 102b of cell B, one fourth are power buses 114a-x that are connected to the power supply system 102c of cell C, and one fourth are power buses 116a-x that are connected to the power supply system 102d of cell D.

Of course, the particular arrangement of power supply systems 102a-d, sets of server racks 106a-x, 108a-x, and sets of power buses 110a-x, 112a-x, 114a-x, 116a-x shown in FIG. 1 is just an example and should not be interpreted as limiting the scope of the present disclosure. There are other alternative arrangements for the power supply systems 102a-d, the sets of server racks 106a-x, 108a-x, and the sets of power buses 110a-x, 112a-x, 114a-x, 116a-x that are consistent with the present disclosure. In other words, the power supply systems 102a-d, the sets of server racks 106a-x, 108a-x, and the sets of power buses 110a-x, 112a-x, 114a-x, 116a-x can be connected in different ways and still utilize the techniques disclosed herein.

The arrangement of the sets of server racks 106a-x, 108a-x and the power buses 110a-x, 112a-x, 114a-x, 116a-x shown in FIG. 1 facilitates either a higher reliability, lower capacity configuration that utilizes a distributed, redundant architecture or a higher capacity, lower reliability configuration that utilizes a non-redundant architecture. More specifically, if the sets of server racks 106a-x, 108a-x and the power buses 110a-x, 112a-x, 114a-x, 116a-x are connected in accordance with a first connection pattern, this produces a higher reliability, lower capacity configuration that utilizes a distributed, redundant architecture. Alternatively, if the sets of server racks 106a-x, 108a-x and the power buses 110a-x, 112a-x, 114a-x, 116a-x are connected in accordance with a second connection pattern, this produces a higher capacity, lower reliability configuration that utilizes a non-redundant architecture. Either configuration can be achieved without any internal changes to the data center 100 other than changing the connections between the sets of server racks 106a-x, 108a-x and the power buses 110a-x, 112a-x, 114a-x, 116a-x. For example, either configuration can be achieved without changing or moving any of the sets of server racks 106a-x, 108a-x or the power buses 110a-x, 112a-x, 114a-x, 116a-x. Some external changes may be needed as well, such as increasing the size of the utility feed to the data center 100 in order to produce the higher capacity, lower reliability configuration.

For simplicity, in the discussion that follows the higher reliability, lower capacity configuration that utilizes a distributed, redundant architecture may be referred to simply as a "distributed, redundant configuration." Similarly, the higher capacity, lower reliability configuration that utilizes a non-redundant architecture may be referred to simply as a "non-redundant configuration."

Figure 1A:
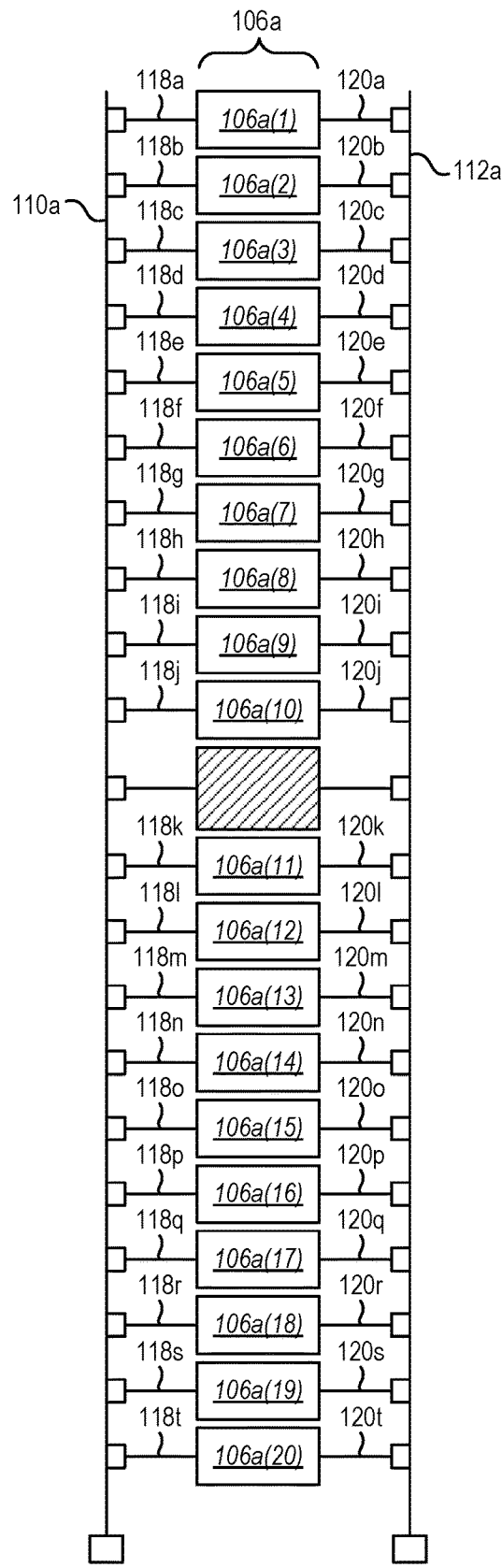
FIG. 1A illustrates an example showing how the server racks within a set of server racks can be connected to power buses in order to produce a distributed, redundant configuration.

FIG. 1A illustrates an example showing how the first set of server racks 106a can be connected to the power buses 110a, 112a in order to produce the distributed, redundant configuration. As shown, the first set of server racks 106a includes a plurality of server racks 106a(1)-106a(20). The server racks 106a(1)-106a(20) are arranged in a row. The power bus 110a runs parallel to a first side of the row of server racks 106a(1)-106a(20). The power bus 112a runs parallel to a second side of the row of server racks 106a(1)-106a(20).

The server racks 106a(1)-106a(20) are arranged in accordance with a connection pattern. In this context, the term "connection pattern" can refer to an arrangement of sequence of connections between the server racks 106a(1)-106a(20) and the power buses 110a, 112a. In the depicted example, each of the server racks 106a(1)-106a(20) is connected to both the power bus 110a that is connected to the power supply system 102a of cell A and the power bus 112a that is connected to the power supply system 102b of cell B.

For example, referring to the server rack 106a(1) that is at the top of the first set of server racks 106a, there is a connection 118a between that server rack 106a(1) and the power bus 110a that is connected to the power supply system 102a of cell A. In addition, there is also a connection 120a between that server rack 106a(1) and the power bus 112a that is connected to the power supply system 102b of cell B. Similarly, referring to the next server rack 106a(2), there is a connection 118b between that server rack 106a(2) and the power bus 110a that is connected to the power supply system 102a of cell A. In addition, there is also a connection 120b between that server rack 106a(2) and the power bus 112a that is connected to the power supply system 102b of cell B. There are similar connections 118c-t between the server racks 106a(3)-(20) and the power bus 110a that is connected to the power supply system 102a of cell A, and similar connections 120c-t between the server racks 106a(3)-(20) and the power bus 112a that is connected to the power supply system 102b of cell B.

The connections 118a-t, 120a-t shown in FIG. 1A between the first set of server racks 106a and the power buses 110a, 112a are representative of the connections that can be made between the various sets of server racks 106a-x, 108a-x and the sets of power buses 110a-x, 112a-x, 114a-x, 116a-x shown in FIG. 1 in order to produce a distributed, redundant configuration. In other words, a distributed, redundant configuration can be achieved by connecting each server rack in the various sets of server racks 106a-x, 108a-x to two different power buses similarly to the way that the server racks 106a(1)-106a(20) shown in FIG. 1A are connected to two different power buses (i.e., the power buses 110a, 112a).

The server racks 106a(1)-106a(20) shown in FIG. 1A are an example of the set of server racks 106a in the data center 100 shown in FIG. 1. Although the server racks 106a(1)-106a(20) shown in FIG. 1A are connected to cell A and cell B, in the depicted embodiment other sets of server racks 106b-x, 108a-x in the data center 100 would be connected to different combinations of cells. For example, each of the server racks in the set of server racks 108m can be connected to both the power bus 114u that is connected to the power supply system 102c of cell C and the power bus 116m that is connected to the power supply system 102d of cell D. As another example, each of the server racks in the set of server racks 108o can be connected to both the power bus 112u that is connected to the power supply system 102b of cell B and the power bus 116o that is connected to the power supply system 102d of cell D. Other combinations are also possible, as shown in FIG. 1.

As noted previously, one or more of the power supply systems within a data center's electrical infrastructure can become unavailable from time to time (e.g., due to component failure and/or scheduled maintenance). The distributed, redundant configuration just described makes it possible for servers to continue to receive power when a power supply system becomes unavailable. In other words, because each server rack draws power from at least two different power supply systems, the distributed, redundant configuration enables load shifting. Therefore, if a power supply system becomes unavailable, the load that was being provided by the now unavailable power supply system can be shifted to one or more other power supply systems, so that the servers that were being supplied by the now unavailable power supply system can continue to receive power.

As an example, consider the loss of the power supply system 102c in cell C. When the power supply system 102c in cell C is operational, it supplies power to several sets of server racks 106g, 106h, 106i, 106l, 106n, 106s, 106t, 106u, 108a, 108b, 108c, 108d, 108e, 108f, 108g, 108h, 108i, 108j, 108k, 108l, 108m, 108p, 108q, 108r in the data center shown in FIG. 1. When the power supply system 102c in cell C becomes unavailable, the load that the power supply system 102c in cell C was supplying to these sets of server racks 106g, 106h, 106i, 106l, 106n, 106s, 106t, 106u, 108a, 108b, 108c, 108d, 108e, 108f, 108g, 108h, 108i, 108j, 108k, 108l, 108m, 108p, 108q, 108r can be transferred from the power supply system 102c in cell C to other power supply systems 102a, 102b, 102d in other cells.

For example, during normal operation the set of server racks 106g receives power from cell A (via a power bus 110g that is connected to the power supply system 102a of cell A) and from cell C (via a power bus 114a that is connected to the power supply system 102c of cell C). When the power supply system 102c in cell C becomes unavailable, the load that the power supply system 102c in cell C was supplying to the set of server racks 106g can be shifted to the power supply system 102a of cell A.

As another example, during normal operation the set of server racks 106n receives power from cell C (via a power bus 114e that is connected to the power supply system 102c of cell C) and from cell B (via a power bus 112f that is connected to the power supply system 102b of cell B). When the power supply system 102c in cell C becomes unavailable, the load that the power supply system 102c in cell C was supplying to the set of server racks 106n can be shifted to the power supply system 102b of cell B.

In a similar manner, load shifting can be performed with respect to the other sets of server racks 106h, 106i, 106l, 106s, 106t, 106u, 108a, 108b, 108c, 108d, 108e, 108f, 108g, 108h, 108i, 108j, 108k, 108l, 108m, 108p, 108q, 108r that were receiving power from the power supply system 102c of cell C before that power supply system became unavailable.

Load shifting in the manner just described involves increasing the amount of power that is supplied by the power supply systems 102a, 102b, 102d in other cells. As discussed above, to reduce the likelihood that load shifting would cause any of the components of the power supply systems 102a, 102b, 102d in the other cells to become overloaded, the electrical infrastructure can be designed so that the power supply systems 102a-d of the various cells operate with a certain amount of reserve capacity under normal circumstances. When a power supply system (e.g., the power supply system 102c in cell C) fails and the load that was being supplied by the now unavailable power supply system is shifted to other power supply systems (e.g., the power supply systems 102a, 102b, 102d in other cells), these other power supply systems can utilize their reserve capacity to supply the additional load.

Consider a numerical example. Suppose that the total capacity of each of the power supply systems 102a-d in each of the cells is 1.2 MW. Because there are four cells, this means that the total capacity is 4.8 MW in this example. Further suppose that the utilization of the data center 100 is limited so that the servers' total power consumption does not exceed 3.6 MW. Therefore, the amount of power supplied by the power supply systems 102a-d in each of the cells can be limited to 0.9 MW during normal operation. This leaves a reserve capacity of 0.3 MW for each of the cells, and a total reserve capacity of 1.2 MW for the entire system (which is equal to the total capacity of one of the power supply systems 102a-d in one of the cells).

Having this much reserve capacity allows the electrical infrastructure of the data center 100 to maintain smooth operation and prevent outages from occurring when one of the power supply systems becomes unavailable. Continuing with the previous example in which the power supply system 102c in cell C becomes unavailable, consider that the power supply system 102c in cell C was previously supplying 0.9 MW of power before becoming unavailable. When the power supply system 102c in cell C becomes unavailable, the other power supply systems 102a, 102b, 102d in the other cells can increase the amount of power that they supply from 0.9 MW to 1.2 MW (which their total capacity) in order to compensate for the loss of power from the power supply system 102c in cell C. Because each of the three other cells increases the amount of power that it supplies by 0.3 MW, the total amount of power that is supplied by these other cells increases by 0.9 MW. Therefore, increasing the amount of power that is supplied by the power supply systems 102a, 102b, 102d in these other cells compensates for the loss of power from the power supply system 102c in cell C.

As can be seen from this example, one benefit of the distributed, redundant configuration is that it is possible for servers to continue to receive power when a power supply system becomes unavailable. However, this higher reliability comes at the cost of lower capacity. In the example just described, the power supply systems 102a-d in the various cells are each capable of supplying 1.2 MW of power, but they only supply 0.9 MW during normal operation in order to maintain some reserve capacity in the event that load shifting becomes necessary.

In scenarios where reliability is more important than capacity, the distributed, redundant configuration can be beneficial. However, there are some scenarios in which capacity can be more important than reliability. Advantageously, the arrangement of power supply systems 102a-d, sets of server racks 106a-x, 108a-x, and sets of power buses 110a-x, 112a-x, 114a-x, 116a-x shown in FIG. 1 makes it possible to easily change from the distributed, redundant configuration to a non-redundant configuration that provides higher capacity. Changing from the distributed, redundant configuration to the non-redundant configuration simply involves changing the connections between the sets of server racks 106a-x, 108a-x and the sets of power buses 110a-x, 112a-x, 114a-x, 116a-x. As noted above, if the sets of server racks 106a-x, 108a-x and the power buses 110a-x, 112a-x, 114a-x, 116a-x are connected in accordance with a first connection pattern, this produces the distributed, redundant configuration. Alternatively, if the sets of server racks 106a-x, 108a-x and the power buses 110a-x, 112a-x, 114a-x, 116a-x are connected in accordance with a second connection pattern, this produces the non-redundant configuration. In the distributed, redundant configuration, each server rack in the various sets of server racks 106a-x, 108a-x is connected to two different power buses. For example, as shown in FIG. 1A, each of the server racks 106a(1)-106a(20) is connected to two different power buses 110a, 112a. In contrast, in the non-redundant configuration, each server rack in the various sets of server racks 106a-x, 108a-x is connected to just one power bus.

Figure 1B:
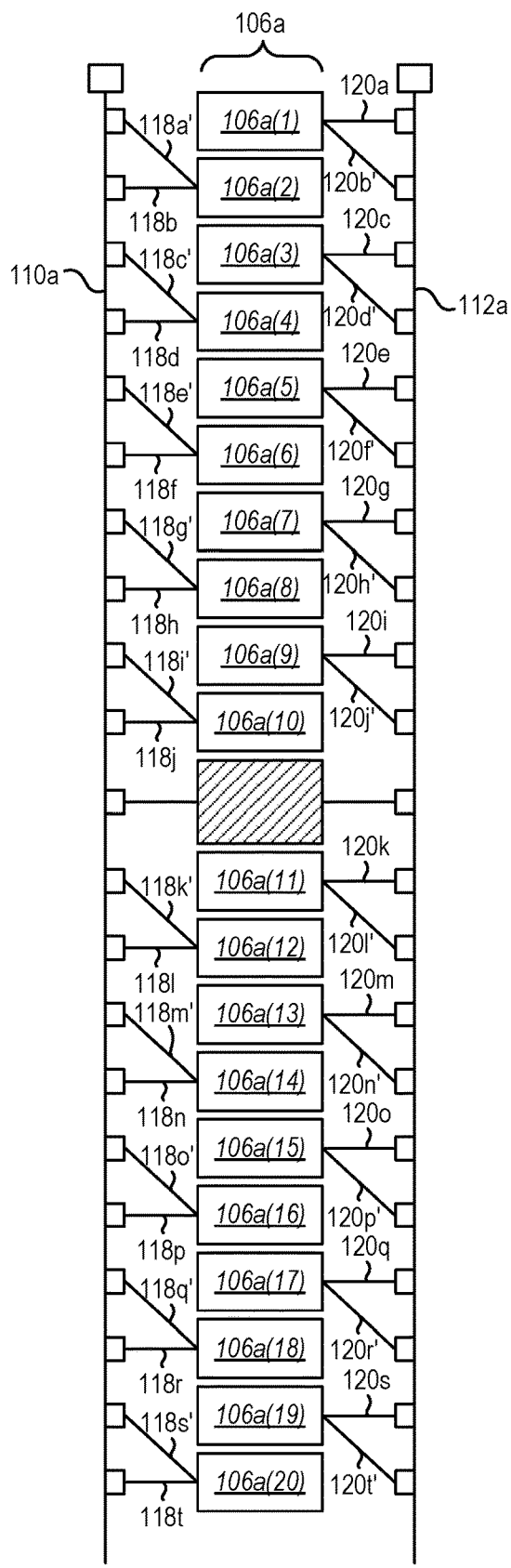
FIG. 1B illustrates an example showing how the server racks within a set of server racks can be connected to power buses in order to produce a non-redundant configuration.

FIG. 1B illustrates an example showing how the first set of server racks 106a can be connected to the power buses 110a, 112a in accordance with a second connection pattern in order to produce the non-redundant configuration.

In the depicted example, each of the server racks 106a(1)-106a(20) includes two distinct connections to the same power bus. For example, referring to the server rack 106a(1) that is located at the top of the first set of server racks 106a, there are two distinct connections (a first connection 120a and a second connection 120b') between that server rack 106a(1) and the power bus 112a that is connected to the power supply system 102b of cell B. However, that server rack 106a(1) is not connected to the power bus 110a that is connected to the power supply system 102a of cell A. Similarly, referring to the next server rack 106a(2), there are two distinct connections (a first connection 118a' and a second connection 118b) between that server rack 106a(2) and the power bus 110a that is connected to the power supply system 102a of cell A. However, that server rack 106a(2) is not connected to the power bus 112a that is connected to the power supply system 102b of cell B.

In a similar manner, each of the server racks 106a(3), 106a(5), 106a(7), 106a(9), 106a(11), 106a(13), 106a(15), 106a(17), 106a(19) includes two distinct connections to the power bus 112a that is connected to the power supply system 102b of cell B. In particular, the server rack 106a(3) includes connections 120c, 120d' to the power bus 112a, the server rack 106a(5) includes connections 120e, 120f to the power bus 112a, the server rack 106a(7) includes connections 120g, 120h' to the power bus 112a, the server rack 106a(9) includes connections 120i, 120j' to the power bus 112a, the server rack 106a(11) includes connections 120k, 120l' to the power bus 112a, the server rack 106a(13) includes connections 120m, 120n' to the power bus 112a, the server rack 106a(15) includes connections 120o, 120p' to the power bus 112a, the server rack 106a(17) includes connections 120q, 120r' to the power bus 112a, and the server rack 106a(19) includes connections 120s, 120t' to the power bus 112a. However, none of the server racks 106a(3), 106a(5), 106a(7), 106a(9), 106a(11), 106a(13), 106a(15), 106a(17), 106a(19) are connected to the power bus 110a that is connected to the power supply system 102a of cell A.

Conversely, each of the server racks 106a(4), 106a(6), 106a(8), 106a(10), 106a(12), 106a(14), 106a(16), 106a(18), 106a(20) includes two distinct connections to the power bus 110a that is connected to the power supply system 102a of cell A. In particular, the server rack 106a(4) includes connections 118c', 118d to the power bus 110a, the server rack 106a(6) includes connections 118e', 118f to the power bus 110a, the server rack 106a(8) includes connections 118g', 118h to the power bus 110a, the server rack 106a(10) includes connections 118i', 118j to the power bus 110a, the server rack 106a(12) includes connections 118k', 118l to the power bus 110a, the server rack 106a(14) includes connections 118m', 118n to the power bus 110a, the server rack 106a(16) includes connections 118o', 118p to the power bus 110a, the server rack 106a(18) includes connections 118q', 118r to the power bus 110a, and the server rack 106a(20) includes connections 118s', 118t to the power bus 110a. However, none of the server racks 106a(4), 106a(6), 106a(8), 106a(10), 106a(12), 106a(14), 106a(16), 106a(18), 106a(20) are connected to the power bus 112a that is connected to the power supply system 102b of cell B.

Adjacent server racks in the row of server racks 106a(1)-106a(20) are connected to different power buses. For example, the server racks 106a(1), 106a(2) are adjacent to one another, and they are connected to different power buses (the server rack 106a(1) is connected to the power bus 112a, and the server rack 106a(2) is connected to the power bus 110a). As another example, the server racks 106a(2), 106a(3) are adjacent to one another, and they are connected to different power buses (the server rack 106a(2) is connected to the power bus 110a, and the server rack 106a(3) is connected to the power bus 112a). In other words, every other server rack in the row of server racks 106a(1)-106a(20) is connected to a different power bus, alternating between the power bus 110a and the power bus 112a.

The connection pattern shown in FIG. 1B between the first set of server racks 106a and the power buses 110a, 112a is representative of the connection pattern that can be used to connect the sets of server racks 106a-x, 108a-x and the sets of power buses 110a-x, 112a-x, 114a-x, 116a-x shown in FIG. 1 in order to produce the non-redundant configuration. In other words, the non-redundant configuration can be achieved by connecting each server rack in the various sets of server racks 106a-x, 108a-x to a single power bus similarly to the way that the server racks 106a(1)-106a(20) shown in FIG. 1B are connected to a single power bus (either the power bus 110a that is connected to the power supply system 102a of cell A, or the power bus 112b that is connected to the power supply system 102b of cell B).

Of course, the non-redundant configuration shown in FIG. 1B is just one example and should not be interpreted as limiting the scope of the present disclosure. There are other ways that the server racks 106a(1)-106a(20) can be connected to the power buses 110a, 112a in order to create a non-redundant configuration.

As noted previously, the server racks 106a(1)-106a(20) shown in FIG. 1A are an example of the set of server racks 106a in the data center 100 shown in FIG. 1. Although each of the server racks 106a(1)-106a(20) shown in FIG. 1B are connected to cell A or cell B, in the depicted embodiment other sets of server racks 106b-x, 108a-x in the data center 100 would be connected to different combinations of cells. For example, each of the server racks in the set of server racks 108m can be connected to either the power bus 114u that is connected to the power supply system 102c of cell C or the power bus 116m that is connected to the power supply system 102d of cell D. As another example, each of the server racks in the set of server racks 108o can be connected to either the power bus 112u that is connected to the power supply system 102b of cell B or the power bus 116o that is connected to the power supply system 102d of cell D. Other combinations are also possible, as shown in FIG. 1.

In the non-redundant configuration, it is not necessary to maintain any reserve capacity. Therefore, the power supply systems 102a-d in all of the cells can operate at full capacity under normal conditions. In the example described previously, it was assumed that the total capacity of each of the power supply systems 102a-d in each of the cells is 1.2 MW. Therefore, in the non-redundant configuration, the power supply systems 102a-d in each of the cells can supply 1.2 MW of power during normal operation (instead of supplying 0.9 MW of power and leaving 0.3 MW as reserve capacity, as is the case with the distributed, redundant configuration).

The non-redundant configuration does not facilitate load shifting. Therefore, when one of the power supply systems becomes unavailable, outages can occur. However, the arrangement of power supply systems 102a-d, sets of server racks 106a-x, 108a-x, and sets of power buses 110a-x, 112a-x, 114a-x, 116a-x shown in FIG. 1 limits the extent of the outages so that only some of the servers are affected. In particular, the extent of the outages is limited to those servers that were previously receiving power from the now unavailable power supply system.

In the example described previously, the loss of the power supply system 102c in cell C was considered. As noted previously, when the power supply system 102c in cell C is operational, it supplies power to several sets of server racks 106g, 106h, 106i, 106l, 106n, 106s, 106t, 106u, 108a, 108b, 108c, 108d, 108e, 108f, 108g, 108h, 108i, 108j, 108k, 108l, 108m, 108p, 108q, 108r in the data center 100 shown in FIG. 1. If the power supply system 102c in cell C becomes unavailable, then these sets of server racks 106g, 106h, 106i, 106l, 106n, 106s, 106t, 106u, 108a, 108b, 108c, 108d, 108e, 108f, 108g, 108h, 108i, 108j, 108k, 108l, 108m, 108p, 108q, 108r can lose power and experience an outage. However, none of the other sets of server racks in the data center 100 shown in FIG. 1 would be affected by the loss of the power supply system 102c in cell C.

Figure 2:
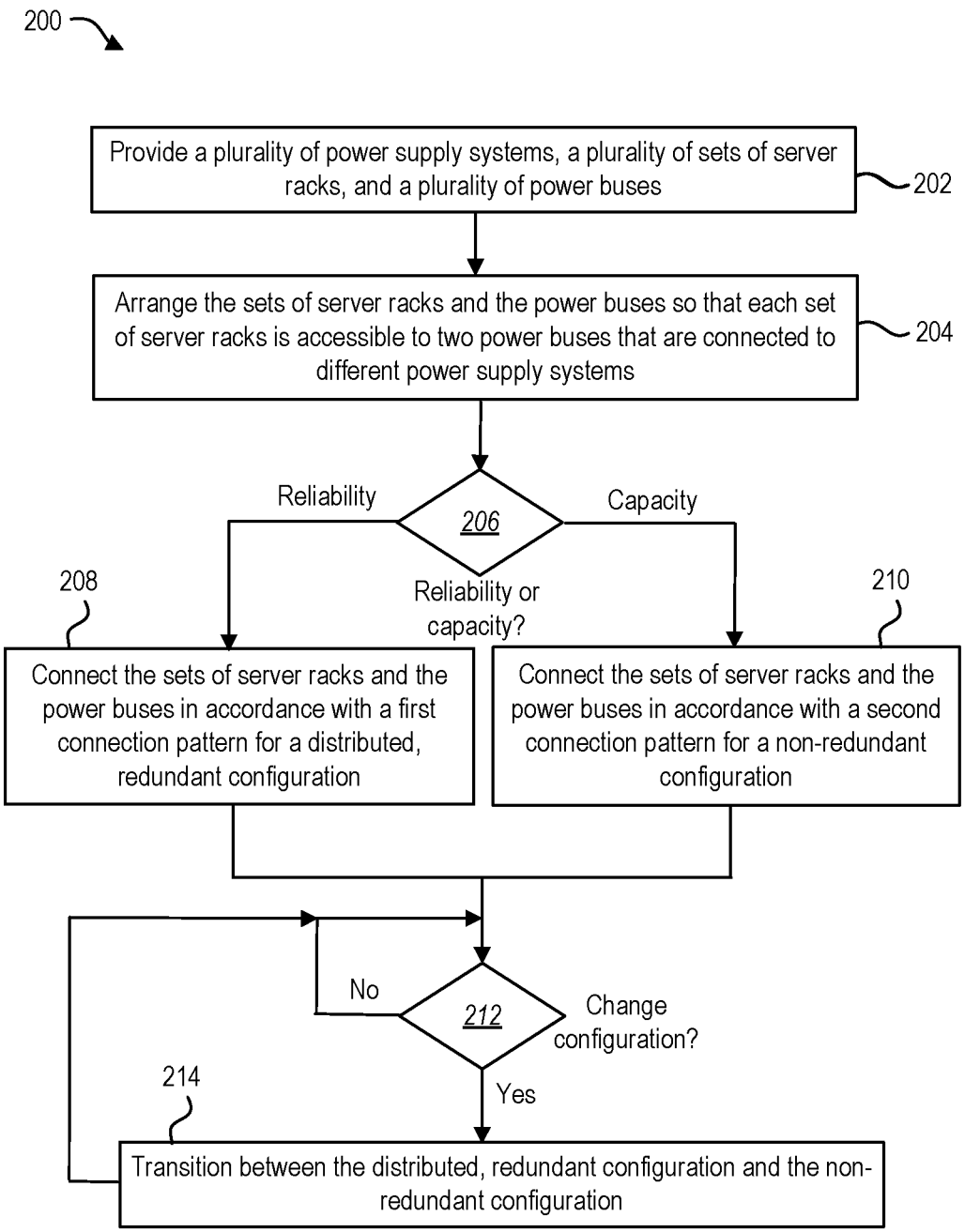
FIG. 2 illustrates an example of a method that can be performed in order to facilitate a distributed, redundant configuration and a non-redundant configuration for the electrical infrastructure that is utilized in a section of a data center.

FIG. 2 illustrates an example of a method 200 that can be performed in order to facilitate different configurations (a distributed, redundant configuration and a non-redundant configuration) for the electrical infrastructure that is utilized in a section of a data center. The method 200 will be described in relation to the data center 100 shown in FIG. 1 and the examples of connection patterns shown in FIGS. 1A and 1B.

The method 200 includes providing 202 a plurality of power supply systems 102a-d, a plurality of sets of server racks 106a-x, 108a-x, and a plurality of power buses 110a-x, 112a-x, 114a-x, 116a-x. As discussed above, the power supply systems 102a-d are configured to supply electrical power to a section of a data center 100. The power buses 110a-x are configured to conduct the electrical power from the power supply systems 102a-d to the server racks 106a-x, 108a-x.

The sets of server racks 106a-x, 108a-x and the power buses 110a-x, 112a-x, 114a-x, 116a-x can be arranged 204 so that each set of server racks is accessible to two power buses that are connected to different power supply systems. For example, in the data center 100 shown in FIG. 1, the first set of server racks 106a is accessible to a power bus 110a that is connected to the power supply system 102a of cell A and a power bus 112a that is connected to the power supply system 102b of cell B.

The method 200 can include determining 206 the relative importance of server reliability compared to power capacity. If server reliability is more important than power capacity, then the method 200 can include connecting 208 the sets of server racks 106a-x, 108a-x and the power buses 110a-x, 112a-x, 114a-x, 116a-x in a distributed, redundant configuration. More specifically, the sets of server racks 106a-x, 108a-x and the power buses 110a-x, 112a-x, 114a-x, 116a-x can be connected 208 in accordance with a first connection pattern in which each server rack is connected to two different power buses that are connected to two different power supply systems. An example of this type of connection pattern is shown in FIG. 1A, in which each of the server racks 106a(1)-106a(20) is connected to both the power bus 110a that is connected to the power supply system 102a of cell A and the power bus 112a that is connected to the power supply system 102b of cell B.

On the other hand, if it is determined 206 that power capacity is more important than server reliability, then the method 200 can include connecting 210 the sets of server racks 106a-x, 108a-x and the power buses 110a-x, 112a-x, 114a-x, 116a-x in a non-redundant configuration. More specifically, the sets of server racks 106a-x, 108a-x and the power buses 110a-x, 112a-x, 114a-x, 116a-x can be connected 210 in accordance with a second connection pattern in which each server rack is connected to only one power bus. An example of this type of connection pattern is shown in FIG. 1B, in which some of the server racks 106a(4), 106a(6), 106a(8), 106a(10), 106a(12), 106a(14), 106a(16), 106a(18), 106a(20) are connected to the power supply system 102a of cell A via the power bus 110a, while other server racks 106a(3), 106a(5), 106a(7), 106a(9), 106a(11), 106a(13), 106a(15), 106a(17), 106a(19) are connected to the power supply system 102b of cell B via the power bus 112a.

Advantageously, the arrangement of power supply systems 102a-d, sets of server racks 106a-x, 108a-x, and sets of power buses 110a-x, 112a-x, 114a-x, 116a-x disclosed herein makes it possible to switch between the distributed, redundant configuration and the non-redundant configuration without any internal changes to the data center 100 other than changing the connections between the sets of server racks 106a-x, 108a-x and the power buses 110a-x, 112a-x, 114a-x, 116a-x. Therefore, the method 200 can include determining 212 whether a configuration change would be desirable. If so, then the method 200 can include transitioning 214 between the distributed, redundant configuration and the non-redundant configuration. For example, if at one point in time reliability is more important than capacity, a section of a data center 100 can initially be set up in the distributed, redundant configuration. If at a later point in time capacity becomes more important than reliability, the section of the data center 100 can be transitioned 214 from the distributed, redundant configuration to the non-redundant configuration simply by changing the connections between the sets of server racks 106a-x, 108a-x and the power buses 110a-x, 112a-x, 114a-x, 116a-x. Alternatively, a transition could be made from the non-redundant configuration to the distributed, redundant configuration if reliability becomes more important than capacity.

Figure 3:
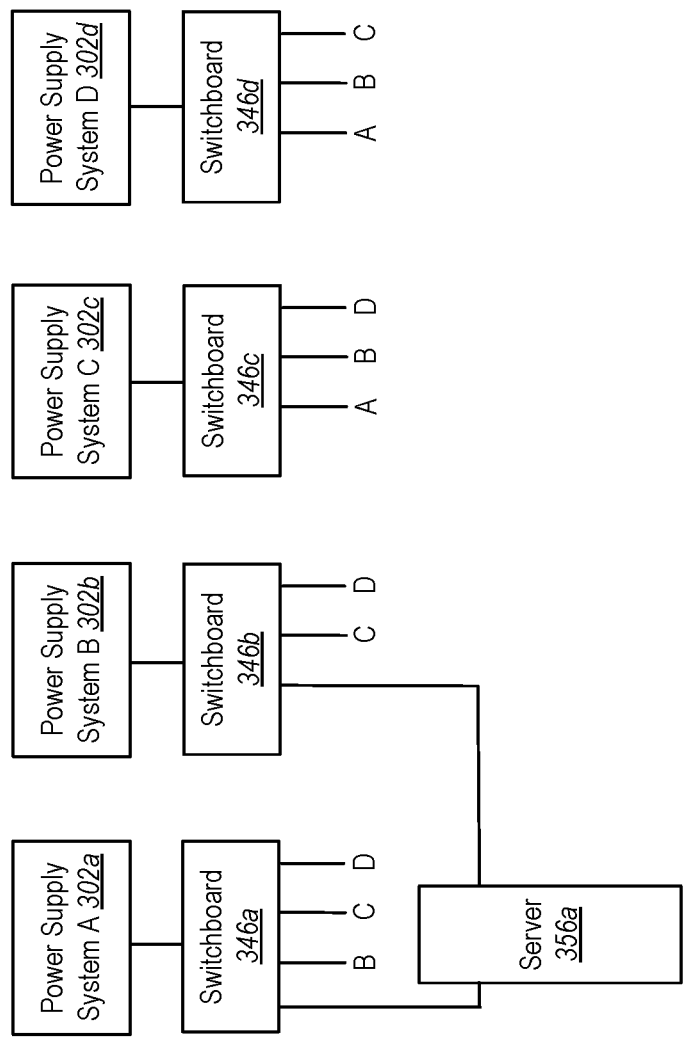
FIG. 3 illustrates examples of components that can be included in the power supply systems of various cells in order to facilitate a distributed, redundant configuration.

FIG. 3 illustrates examples of components that enable the power supply systems 302a-d of various cells to be connected so as to facilitate a distributed, redundant configuration. As before, it will be assumed that there are four cells that are configured to supply power to servers in a particular section of the data center. These cells will once again be referred to as cell A, cell B, cell C, and cell D. Cell A includes a power supply system 302a, cell B includes a power supply system 302b, cell C includes a power supply system 302c, and cell D includes a power supply system 302d. The system 300 includes a plurality of switchboards 346a-d.

A server 356a is shown in FIG. 3. In addition to receiving electrical power from the power supply system 302a of cell A, the server 356a also receives electrical power from the power supply system 302b of cell B. In particular, the server 356a receives electrical power from the power supply system 302a of cell A via the first switchboard 356a, and the server 356b receives electrical power from the power supply system 302b of cell B via the second switchboard 356b. Although for the sake of simplicity only one server 356a is shown in FIG. 3, the power supply systems 302a-d can, of course, supply power to a plurality of servers. Each server can be configured to draw power from at least two different power supply systems when the overall system is connected in accordance with a distributed, redundant configuration.

In addition to being connected to the power supply system 302a of cell A, the first switchboard 346a also includes connections to the power supply system 302b of cell B, the power supply system 302c of cell C, and the power supply system 302c of cell D. If the power supply system 302a of cell A should fail or otherwise become unavailable, the switchboard 346a can transfer the server 356a (and other servers being supplied by cell A) to the power supply systems 302b, 302c, 302d of the B, C, and D cells.

Like the first switchboard 346a, the other switchboards 346b-d are also connected to the power supply systems 302a-d of each of the cells. If the power supply system 302b of cell B becomes unavailable, the second switchboard 346b can transfer the servers being supplied by the power supply system 302b of cell B to the power supply systems 302a, 302c, 302d of the A, C, and D cells. If the power supply system 302c of cell C becomes unavailable, the third switchboard 346c can transfer the servers being supplied by the power supply system 302c of cell C to the power supply systems 302a, 302b, 302d of the A, B, and D cells. If the power supply system 302d of cell D becomes unavailable, the fourth switchboard 346d can transfer the servers being supplied by the power supply system 302d of cell D to the power supply systems 302a, 302b, 302c of the A, B, and C cells.

In some embodiments, different sections of a data center can utilize different configurations. For example, one section of a data center can be configured in accordance with a distributed, redundant configuration, while another section of the data center can be configured in accordance with a non-redundant configuration.

Figure 4:
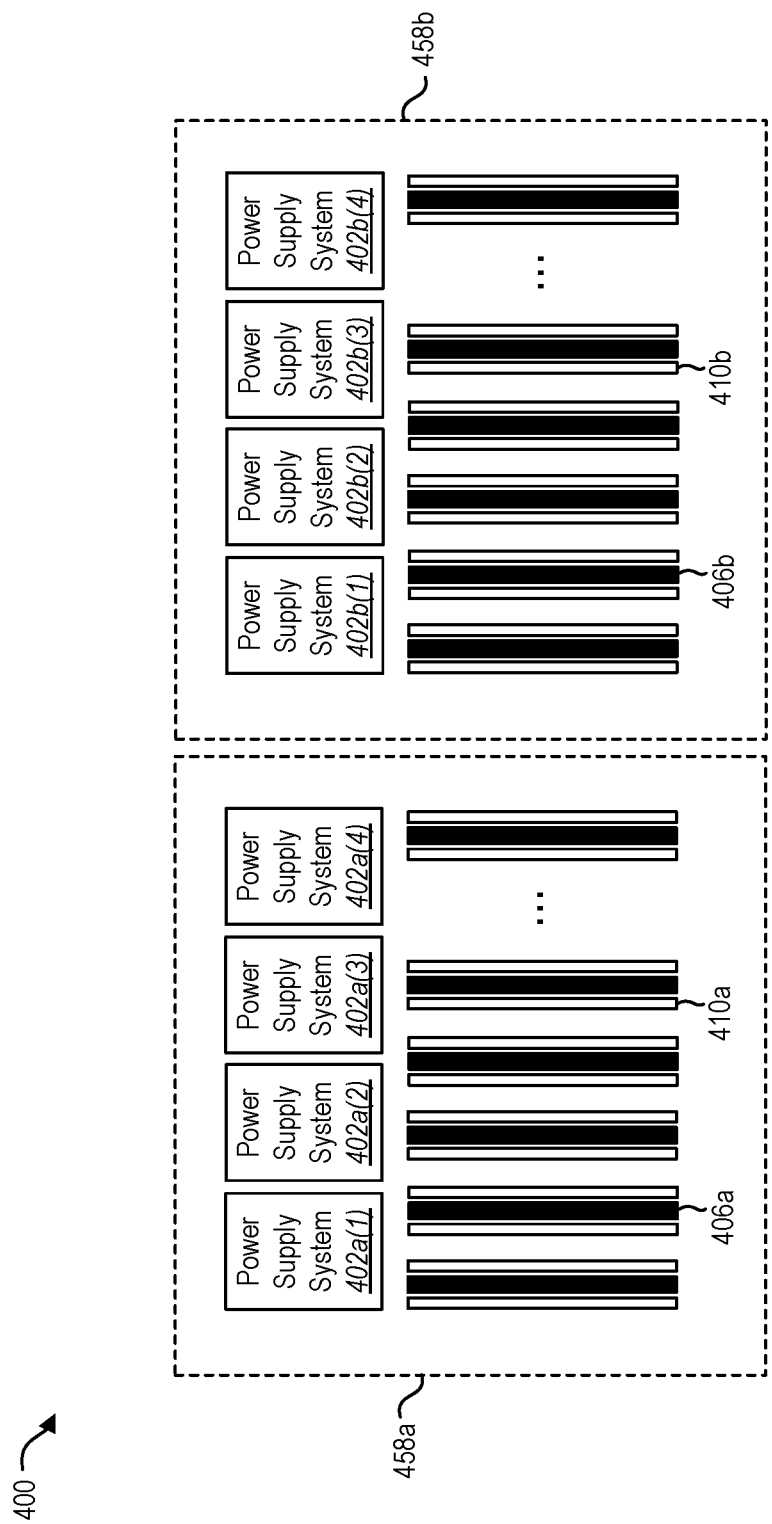
FIG. 4 illustrates an example of a data center in which different sections utilize different configurations.

FIG. 4 illustrates an example of a data center 400 in which different sections utilize different configurations. In the depicted example, the data center 400 includes a first section 458a and a second section 458b. The first section 458a of the data center 400 includes four power supply systems 402a(1), 402a(2), 402a(3), 402a(4). Similarly, the second section 458b of the data center 400 includes four power supply systems 402b(1), 402b(2), 402b(3), 402b(4). Both sections 458a, 458b of the data center 400 also include a plurality of sets of server racks 406a, 406b, and a plurality of power buses 410a, 410b that are configured to conduct electrical power from the power supply systems 402a, 402b to the sets of server racks 406a, 406b.

The different sections 458a-b of the data center 400 can utilize different configurations. For example, the first section 458a of the data center 400 can be configured in accordance with a distributed, redundant configuration in which each server rack in the various sets of server racks 406a is connected to two different power buses 410a, similarly to the way that the server racks 106a(1)-106a(20) shown in FIG. 1A are connected to two different power buses 110a, 112a. On the other hand, the second section 458b of the data center 400 can be configured in accordance with a non-redundant configuration in which each server rack in the various sets of server racks 406b is connected to only one power bus 410b, similarly to the way that the server racks 106a(1)-106a(20) shown in FIG. 1B are connected to a single power bus (either the power bus 110a or the power bus 112b). These different configurations can be achieved in the different sections 458a, 458b of the data center 400 by the way that the connections between the sets of server racks 406a, 406b and the power buses 110a, 112b are configured, as described above.

The steps, operations, and/or actions of the methods described herein may be interchanged with one another without departing from the scope of the claims. In other words, unless a specific order of steps, operations, and/or actions is required for proper functioning of the method that is being described, the order and/or use of specific steps, operations, and/or actions may be modified without departing from the scope of the claims.

The term "determining" (and grammatical variants thereof) can encompass a wide variety of actions. For example, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The terms "comprising," "including," and "having" are intended to be inclusive and mean that there can be additional elements other than the listed elements. Additionally, it should be understood that references to "one embodiment" or "an embodiment" of the present disclosure are not intended to be interpreted as excluding the existence of additional embodiments that also incorporate the recited features. For example, any element or feature described in relation to an embodiment herein may be combinable with any element or feature of any other embodiment described herein, where compatible.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A system, comprising:
    a plurality of power supply systems that are configured to supply electrical power to at least a section of a data center;
    a first plurality of sets of server racks;
    a first plurality of power buses that are configured to conduct the electrical power from at least some of the plurality of power supply systems to the first plurality of sets of server racks, wherein the first plurality of sets of server racks and the first plurality of power buses are connected in accordance with a first connection pattern to create a distributed, redundant configuration;
    a second plurality of sets of server racks; and
    a second plurality of power buses that are configured to conduct the electrical power from at least some of the plurality of power supply systems to the second plurality of sets of server racks, wherein the second plurality of sets of server racks and the second plurality of power buses are connected in accordance with a second connection pattern to create a non-redundant configuration.

2. The system of claim 1, wherein the distributed, redundant configuration provides higher server reliability than the non-redundant configuration.

3. The system of claim 1, wherein the non-redundant configuration provides higher power capacity than the distributed, redundant configuration.

4. The system of claim 1, wherein each server rack in the first plurality of sets of server racks is connected to two different power supply systems.

5. The system of claim 1, wherein each server rack in the second plurality of sets of server racks is connected to only one power supply system.

6. The system of claim 1, wherein the plurality of power supply systems comprise:
    a first plurality of power supply systems that maintain reserve capacity during normal operation; and
    a second plurality of power supply systems that operate at full capacity without maintaining any reserve capacity.

* * * * *